(12) United States Patent
Zhu et al.

(10) Patent No.: US 12,068,238 B2
(45) Date of Patent: Aug. 20, 2024

(54) BACK-END-OF-LINE (BEOL) HIGH RESISTANCE (Hi-R) CONDUCTOR LAYER IN A METAL OXIDE METAL (MOM) CAPACITOR

(71) Applicant: QUALCOMM Incorporated, San Diego, CA (US)

(72) Inventors: John Jianhong Zhu, San Diego, CA (US); Junjing Bao, San Diego, CA (US); Haining Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 381 days.

(21) Appl. No.: 17/234,166

(22) Filed: Apr. 19, 2021

(65) Prior Publication Data
US 2022/0336346 A1    Oct. 20, 2022

(51) Int. Cl.
*H01L 23/522*      (2006.01)
*H01L 23/552*      (2006.01)
*H01L 49/02*      (2006.01)

(52) U.S. Cl.
CPC ...... *H01L 23/5223* (2013.01); *H01L 23/5228* (2013.01); *H01L 23/552* (2013.01); *H01L 28/87* (2013.01)

(58) Field of Classification Search
CPC ......... H01L 28/87; H01L 28/20; H01L 28/40; H01L 23/5223; H01L 23/5228; H01L 23/552; H01L 23/5225
See application file for complete search history.

(56) References Cited

U.S. PATENT DOCUMENTS

| | | | |
|---|---|---|---|
| 2007/0123015 A1* | 5/2007 | Chinthakindi | H01L 28/87 257/350 |
| 2014/0197520 A1* | 7/2014 | Choi | H01L 28/20 257/536 |
| 2017/0271497 A1* | 9/2017 | Fayed | H01L 23/5286 |
| 2019/0089030 A1 | 3/2019 | Song et al. | |
| 2019/0304905 A1 | 10/2019 | Wee et al. | |
| 2019/0305077 A1* | 10/2019 | Feng | H01L 23/5223 |
| 2023/0274989 A1* | 8/2023 | Abdul Razak | H01L 23/057 257/707 |

FOREIGN PATENT DOCUMENTS

WO      2010056573 A2      5/2010

OTHER PUBLICATIONS

International Search Report and Written Opinion—PCT/US2022/071267—ISA/EPO—Jul. 14, 2021.

* cited by examiner

*Primary Examiner* — Omar F Mojaddedi
(74) *Attorney, Agent, or Firm* — Muncy, Geissler, Olds & Lowe, P.C./Qualcomm Incorporated

(57) ABSTRACT

A metal oxide metal (MOM) capacitor and methods for fabricating the same are disclosed. The MOM capacitor includes a first metal layer having a first plurality of fingers, each of the first plurality of fingers configured to have alternating polarities. A high resistance (Hi-R) conductor layer is disposed adjacent the first metal layer in a plane parallel to the first metal layer.

26 Claims, 11 Drawing Sheets

Top View

BACK-END-OF-LINE (BEOL) HIGH RESISTANCE (Hi-R) CONDUCTOR LAYER IN A METAL OXIDE METAL (MOM) CAPACITOR

FIELD OF DISCLOSURE

This disclosure generally relates to capacitors, and more specifically, but not exclusively, to compact, space efficient metal oxide metal (MOM) capacitors and methods used to manufacture them.

BACKGROUND

Modern electronics are becoming more prevalent as smaller electronics enable more applications for the small electronics. One of the basic and widely used components of modern electronics is the capacitor.

There is a constant demand to reduce or miniaturize the size and footprint of conventional integrated circuit (IC) devices, packages, etc. The IC packages may include multiple components on a package (like capacitors). It is technically challenging to design and fabricate high density capacitors within a decreasing footprint of modern ICs.

Accordingly, there is a need to optimize or improve IC area scaling for evolving and advanced technology nodes. Methods and techniques for increasing design densities within given technology nodes are also highly desired. In particular, it is desired to increase MOM density and/or lower metal utilization in advanced technology nodes.

Accordingly, there is a need for systems, apparatus, and methods that overcome the deficiencies of conventional approaches including the methods, system and apparatus provided in the following disclosure.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

At least one aspect includes an apparatus comprising a metal oxide metal (MOM) capacitor, the MOM capacitor comprising: a first metal layer having a first plurality of fingers, each of the first plurality of fingers configured to have alternating polarities; and a high resistance (Hi-R) conductor layer disposed adjacent the first metal layer in a plane parallel to the first metal layer. A Hi-R resistor may be made from a Hi-R conductor layer.

At least one other aspect includes a method of fabricating a metal oxide metal (MOM) capacitor comprising: forming a first metal layer having a first plurality of fingers, each of the first plurality of fingers configured to have alternating polarities; and forming a high resistance (Hi-R) conductor layer disposed adjacent the first metal layer in a plane parallel to the first metal layer.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1A:
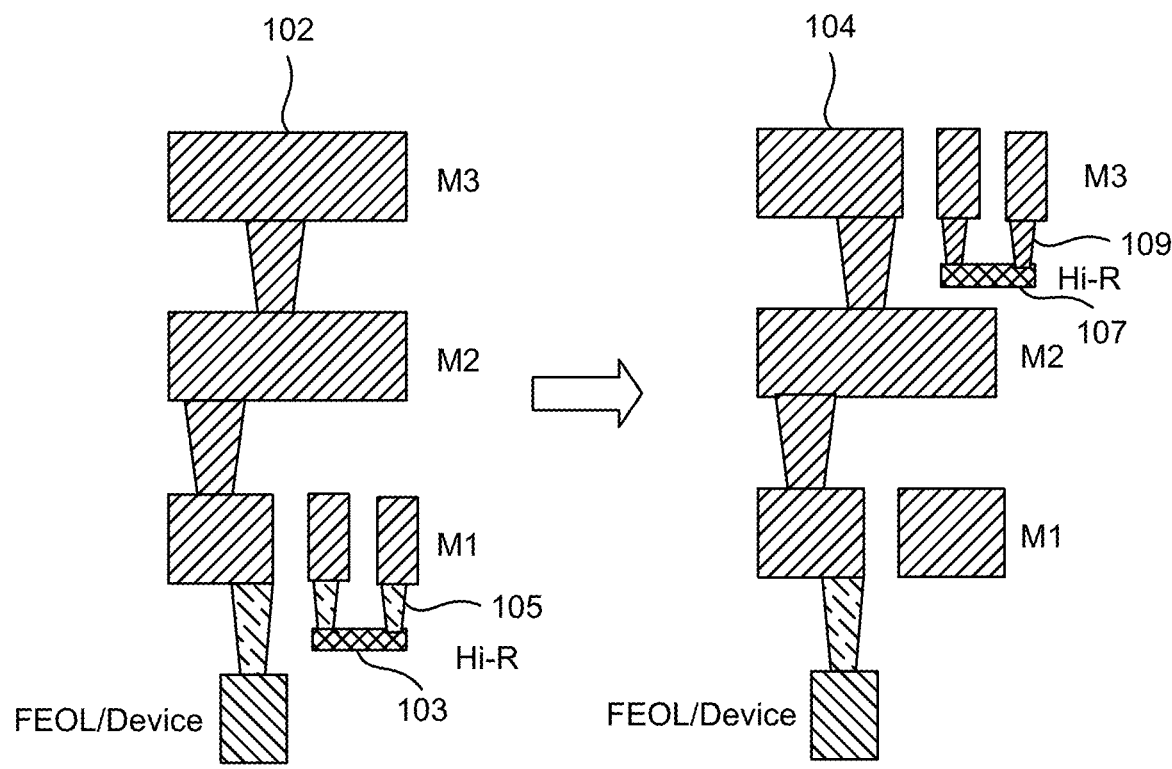
FIG. 1A illustrates two exemplary front-end-of line (FEOL) devices in accordance with one or more aspects of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein mitigate shortcomings of the conventional methods, apparatus, and systems, as well as other previously unidentified needs.

In the following disclosure, generally, it is understood that the drawings and their various elements are not drawn to any type of scale or measured reference frame. Further, relative terms, such as "above," "below," "top," "bottom," "upper," and "lower" are used to describe the various elements' relationships to one another, as illustrated in the accompanying drawings. It is understood that these relative terms are intended to encompass different orientations of the device and/or elements in addition to the orientations depicted in the drawings.

It is understood that these relative terms are intended to encompass different orientations of the device and/or elements in addition to the orientation depicted in the drawings. For example, if the device were inverted with respect to the view in the drawings, an element described as "above" another element, for example, would now be below that element.

As noted above, there is a desire to optimize or improve IC area scaling for evolving and advanced technology nodes. The various aspects disclosed offer viable ways to increase MOM density or lower metal utilization by taking advantage of high-resistance (Hi-R) resistors that have moved from front-end-of-line (FEOL) to back-end-of-line (BEOL) in advanced technology nodes.

The preceding technical advantages may also use a Hi-R conductor layer as part of an active layer or shielding layer of a MOM. Another advantage is that these methods and devices require no additional masking or processing steps to manufacture. This ultimately reduces costs, simplifies the manufacturing process and improves yields.

Electrical properties and characteristics of a Hi-R resistor (e.g., resistance and may be made from conductor layers) can be controlled by manipulating the geometries of the layers, such as by selecting the length, width and thickness of the layer, for example. The Hi-R conductor layer may be part of the active layer or the shielding layer of the MOM capacitor.

An example of a Hi-R conductor layer includes a thin film metal resistor that is made of Titanium nitride (TiN) or Tungsten silicide (WSix). The word "high" when used in Hi-R may be viewed in relation to the high precision and high sheet resistance properties possessed. In one example, the thin film used may be a thickness of approximately 5 nm and formed of a high resistivity material. This is in comparison to a front end of line (FEOL) resistor, such as a substrate resistor.

More generally, a Hi-R conductor layer can be generally considered a metal resistor with relatively small geometries and dimensions. For example, some possible dimensions are widths ranging from 0.1 um to 10 um, and lengths ranging from 0.5 um to 40 um.

It will be appreciated that the Hi-R conductor layer inside the MOM region is connected to the metal layer above by vias. The Hi-R conductor layer inside the MOM has a size larger than that for conventional metal resistors and therefore the size of vias used can be more flexible than conventional designs and result in many technical advantages.

Figure 2A:
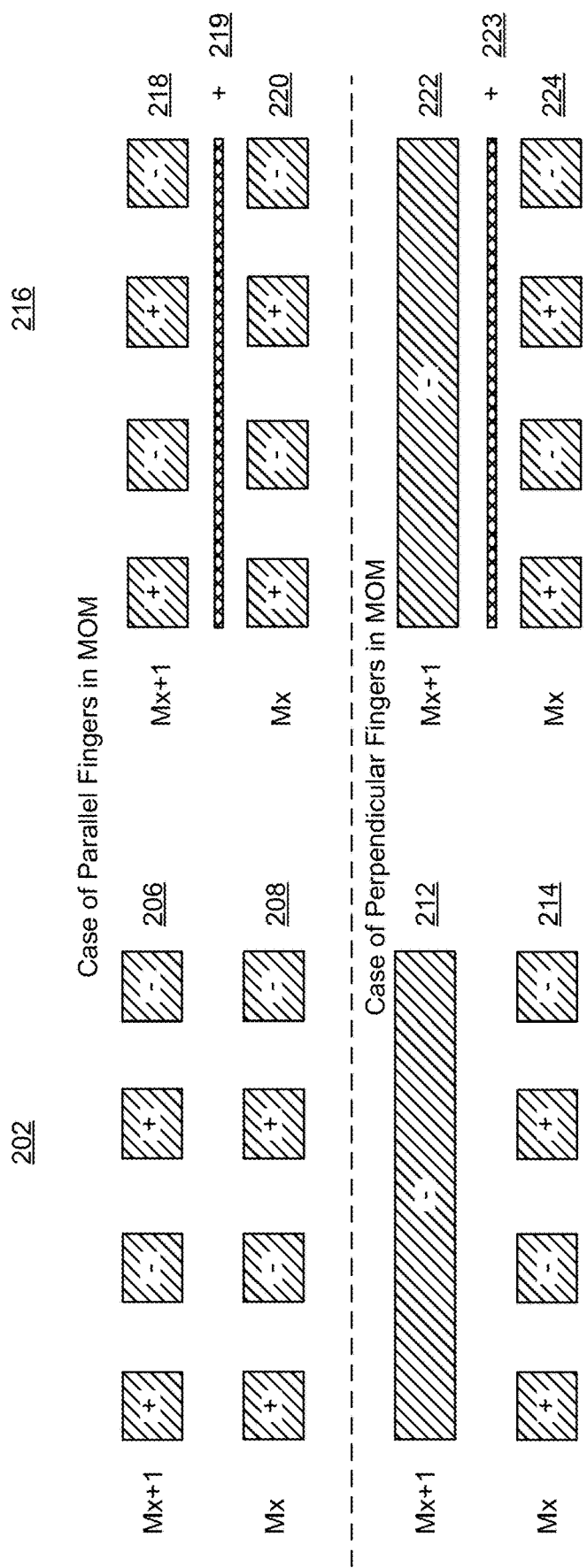
FIG. 2A illustrates an exemplary cross-sectional comparison between a conventional MOM capacitor versus a MOM capacitor in accordance with one or more aspects of the disclosure.

Via connections to a Hi-R resistor often follow certain shapes and sizes (typically a rectangular shape) to achieve a lower connection resistance. However, a connection to a capacitor node may not need this low connection resistance. Although a low R connection is often a desired design objective. This allows the implementation of square vias (vs. rectangular), thereby providing more flexibility in via size and shape. These technical advantages and design flexibility also applies to the sizing of vias (e.g. larger size vias). FIG. 2A will later illustrate this in greater detail.

FIG. 1A illustrates two exemplary configurations (102 and 104) of devices in accordance with various aspects of the present disclosure. In FIG. 1A, a portion of device 102 includes three interconnected metal layers shown: M1, M2 and M3. One exemplary electrical interconnect is a via 105. This also includes a Hi-R conductor layer 103, which is connected to metal layer M1 by the via 105. Note that in this example, the Hi-R conductor layer 103 is shown in the lower-level region of the device (e.g., FEOL).

The level of resistance of a Hi-R conductor layers may be selected in accordance with various design factors and objectives. Some of these considerations are the amount of energy that may be dissipated, a desired resistance level that works well with the electrical circuitry, a desired precision level, costs etc.

More specifically, one implementation of the Hi-R conductor layer is a layer of Titanium Nitride (TiN). In one example, the TiN layer may have a sheet resistance of 300-600 ohm/square area. This ohm per square area notation indicates a unit of sheet resistance, which reflects the combination of conductor material resistivity and a layer thickness. When this type of Hi-R conductor layer is patterned for use as part of MOM in accordance with one aspect, the patterned conductor layer may have a thickness in the range of 0.2 to 500 um.

In accordance with another aspect of the disclosure, a portion of a device 104 of FIG. 1A, also includes three interconnected metal layers: M1, M2 and M3. A Hi-R conductor layer 107 is shown connected to metal layer M3 by a vias 109. Note that in this example, the Hi-R conductor layer 107 is shown in the upper-level region of the device (e.g., BEOL). It will be appreciated that in various other aspects of the disclosure, the Hi-R conductor layer 107 may also be located in other regions of the interconnected metal layers, such as the middle regions (not show in FIG. 1). Further, it will be appreciated that the number of metal layers may differ from the illustrated examples and may contain more than the three metal layers illustrated.

Figure 1B:
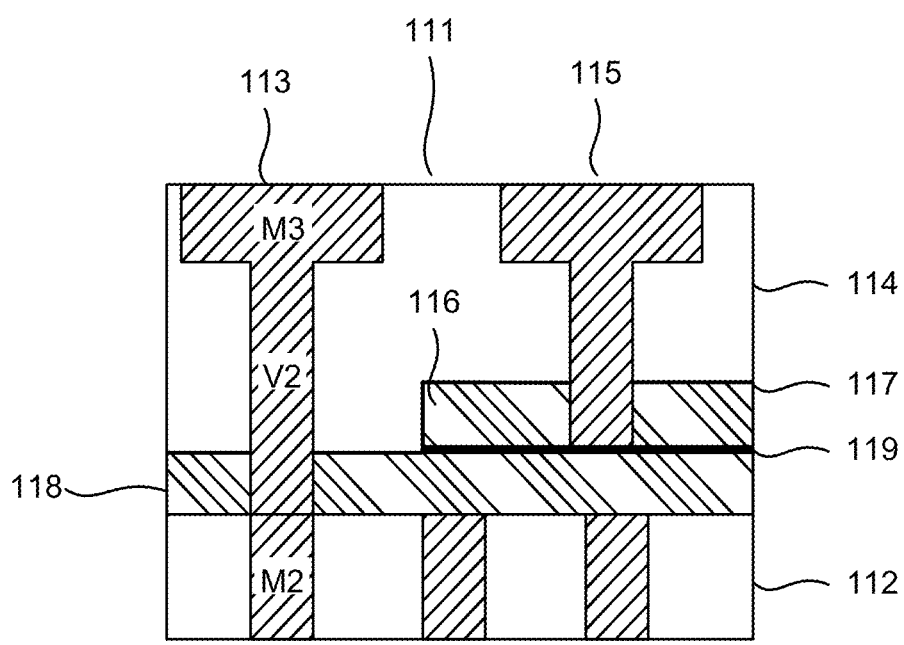
FIG. 1B illustrates an exemplary stack configuration in accordance with one aspect of the disclosure.

FIG. 1B illustrates an exemplary device stack 111 configuration of a front-end-of line (FEOL) device. As a frame of reference, FIG. 1B may be located somewhere between the metal layers M2 to M3 illustrated in FIG. 1A. A lower layer 112 (e.g. a low k layer) and an upper layer 114 of the device stack 111 is shown. Two interconnected metal layers (M2 and M3) are shown connected by a via (V2) in 113. An upper layer region 116 is shown [e.g. Silicon Carbon Oxide Nitride (SiCON)], as well as a lower layer region 118 (e.g. SiCON).

An exemplary metal layer and via shown in 115 is copper (Cu). Also shown is an exemplary Aluminum Nitride (AlN) layer 117 and an exemplary Titanium Nitride (TiN) layer 119. Please note that this TiN layer 119 is the Hi-R conductor layer. Those skilled in the art will appreciate that other materials and combinations of materials may be used to implement these features.

FIG. 2A illustrates an exemplary cross-sectional comparison between a conventional MOM capacitor 202 and a MOM capacitor 216 in accordance with various aspects of the disclosure. The portions of MOM capacitor 202 and MOM capacitor 216 shown above the horizontal dashed line illustrate the case of parallel fingers in a MOM. The portions of MOM capacitor 202 and MOM capacitor 216 shown below the horizontal dashed line illustrate the case of perpendicular fingers in a MOM.

The parallel fingers in the MOM capacitor 202 include an upper metal layer Mx+1, as well as a lower metal layer Mx. The upper metal layer Mx+1 is shown with metal fingers 206 of alternating plus and minus polarities. and lower metal layer Mx is also shown with metal fingers 208 of alternating plus and minus polarities.

In FIG. 2A, MOM capacitor 216 includes metal fingers 218 in upper metal layer Mx+1 and metal fingers 220 in lower metal layer Mx of the MOM capacitor 216. One example of the metal layer material is copper (Cu). The metal fingers 218 are orientated in parallel with the metal fingers 220. The upper metal layer Mx+1 and lower metal layer Mx+1 are shown with metal fingers (218 and 220) of alternating polarities as indicated by the plus and minus signs. Additionally, in accordance with various aspects disclosed, a Hi-R conductor layer 219 is disposed between the lower metal layer Mx and the upper metal layer Mx+1. In this configuration, the Hi-R conductor layer 219 has a positive (+) polarity can be used as a MOM capacitor 216 active layer to increase capacitor density.

In accordance with various aspects disclosed, one or more dielectric layers may be provided between the metal layers and the Hi-R conductor layer. In one aspect of the disclosure, a thin cap layer (e.g. SiCN or AlN) and a dielectric layer (e.g. a low k dielectric layer) may be provided above the Hi-R conductor layer and below Mx+1. From Mx to the Hi-R conductor layer, there may be a SiCN+ oxide etch stop layer and a low k dielectric layer. It will be appreciated that a conventional Mx to Mx+1 stack without having a Hi-R conductor layer, may have a SiCN+ oxide etch stop layer and a low k dielectric layer.

Further, it will be appreciated that in some aspects, the patterned Hi-R conductor layer is connected to a respective MOM node (e.g., +node in the illustrated example) on the metal layer above by vias that are similar to those shown in 109 of FIG. 1 and are used to connect a metal resistor to Mx+1. In some aspects, the MOM capacitance density is increased, because of the addition of one more active layer (of a Hi-R conductor layer) in the MOM.

Also illustrated in FIG. 2A is a cross-sectional comparison between a conventional MOM capacitor 202 versus a MOM capacitor 216, in accordance with various aspects of the present disclosure. Both the conventional MOM capacitor 202 and the MOM capacitor 216 are configured with perpendicular metal fingers.

In FIG. 2A, a conventional MOM capacitor 202 shows a portion of upper metal layer Mx+1 having a negative polarity in the MOM capacitor 216. The upper metal layer Mx+1, in the illustrated portion, is a non-segmented continuous portion of fingers 212 that is perpendicular to the fingers 214 of alternating polarity in lower metal layer Mx.

In another portion of FIG. 2A, the MOM capacitor 216, includes a portion of upper metal layer Mx+1 having a negative polarity and represents a portion of fingers 222 in the MOM capacitor 216. The upper metal layer Mx+1, in the illustrated portion, is a continuous portion of a finger that is perpendicular to the fingers 224 of alternating polarity in lower metal layer Mx. Additionally, in MOM 216, a Hi-R conductor layer 223 is disposed between the fingers 222 of upper metal layer Mx+1 and the fingers 224 of the lower metal layer Mx. The Hi-R conductor layer 223, in the illustrated configuration, may be used as an additional MOM capacitor active layer to increase the capacitor density.

It will be appreciated that the various aspects disclosed are not limited to the illustrated configurations. For example, the location of one or more MOM capacitors with a Hi-R conductor layer may be located in the middle or more central regions of the device, in addition to the upper-level regions discussed above. Further, one or more MOM capacitors with Hi-R conductor layers may located in any combination of the three regions discussed above.

Figure 2B:
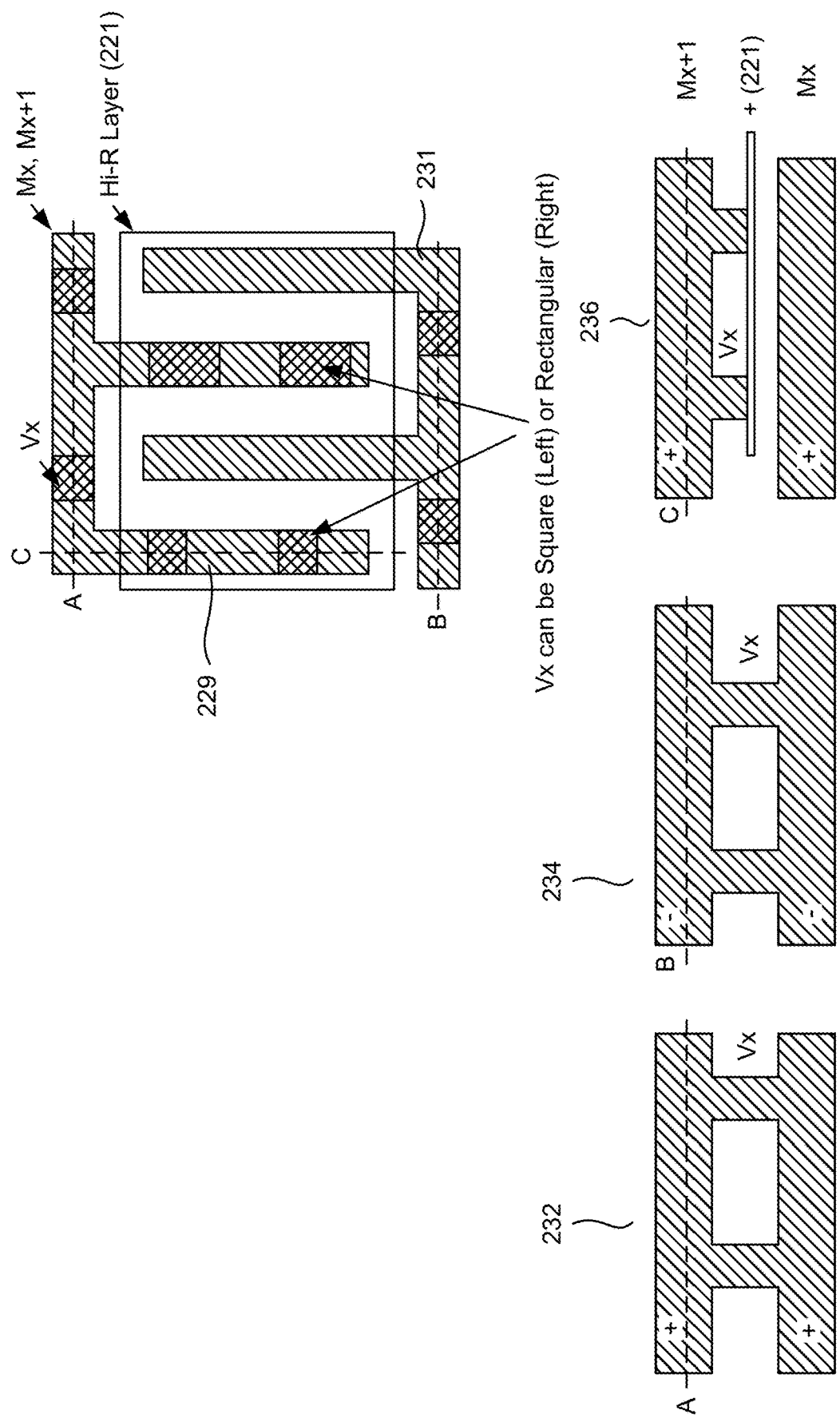
FIG. 2B illustrates another exemplary cross-sectional view in accordance with one or more aspects of the disclosure.

FIG. 2B illustrates a plurality of metal fingers in an exemplary connection configuration of an exemplary device. A Hi-R layer 221 is shown with two metal fingers 229 and 231. In this example, the two metal fingers may be formed from two metal layers Mx and Mx+1. In metal element 229, the four vias shown are square in shape, while the two vias shown are rectangular in shape. In metal element 231, only two vias are shown and they are square in shape. Those skilled in the art will appreciate that various via configurations and/or various geometrical shapes of the vias may be implemented, and that different shapes of the vias can be used in various combinations with each other. Also shown is a Hi-R layer 221 (another exemplary view of the Hi-R layer is shown in 219 of FIG. 2A).

Further aspects may include one or more of the following features discussed in the various example aspects. For example, the MOM capacitor can include a second metal layer (e.g., Mx, Mx+1), where the Hi-R conductor layer is disposed between the first metal layer (e.g., Mx) and the second metal layer (e.g., Mx+1). In additional aspects, the second metal layer (Mx) can have a second plurality of fingers (220), each of the second plurality of fingers being configured to have alternating polarities and being orientated in parallel with the first plurality of metal fingers (218). In other aspects, the second metal layer (Mx) can have a second plurality of fingers (224), each of the second plurality of fingers being configured to have alternating polarities and being orientated perpendicular to the first plurality of fingers (222).

FIG. 2A also illustrates three exemplary MOM capacitor structures (232, 234, 236) are also shown, including their metal layers and polarities (Mx and Mx+1), connecting vias (Vx), and the location of the Hi-R layer 221 in the structure shown in 225.

Figure 3:
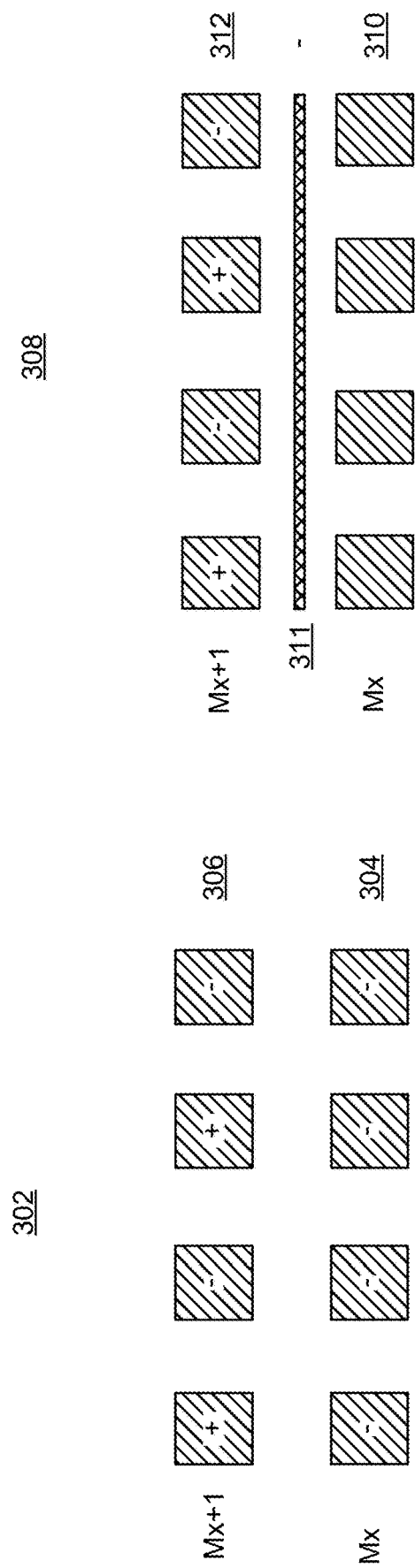
FIG. 3 illustrates another exemplary comparison between a conventional MOM capacitor versus a MOM capacitor in accordance with one or more aspects of the disclosure.

FIG. 3 illustrates another comparison between a conventional MOM capacitor 302 versus a MOM capacitor 308, in accordance with various aspects of the present disclosure.

In FIG. 3, MOM capacitor 302 is illustrated as a conventional two-metal layer structure having a lower metal layer Mx and an upper metal layer Mx+1. The upper metal layer Mx+1 represents an active layer of having alternating polarity of fingers 306. The lower metal layer Mx represents a bottom shielding layer having metal fingers 308 of the same polarity. In the illustrated configuration, the lower metal layer Mx has a negative polarity. Note that in this conventional structure, there is no Hi-R conductor layer in between the lower metal layer Mx fingers 304 and the upper metal layer Mx+1 fingers 306.

In another portion of FIG. 3, MOM capacitor 308 is also illustrated with a two-metal layer configuration. The upper metal layer Mx+1 represents active layer of the MOM capacitor 308 having alternating polarity fingers 312. The MOM capacitor 308 additionally has a Hi-R conductor layer 311 which functions as a bottom shielding layer in this configuration (e.g. the bottom shielding layer may have a negative polarity as illustrated). Using the Hi-R conductor layer 311 as the bottom shielding layer allows the lower metal layer Mx to be saved for other wiring/connection 310 and not to be dedicated to the MOM capacitor 308. This allows for improved utilization of the metal layers within a given design. In alternative aspects (not illustrated), the Hi-R conductor layer may be used as a top shielding layer, e.g., where the lower metal layer Mx would include fingers (e.g., 310) configured as an active layer of the MOM capacitor (not shown in FIG. 3). It will be appreciated, that in the configuration with the Hi-R conductor layer 311 as a top shielding layer, the upper metal layer Mx+1 can be saved for other wiring/connection purposes.

Figure 4:
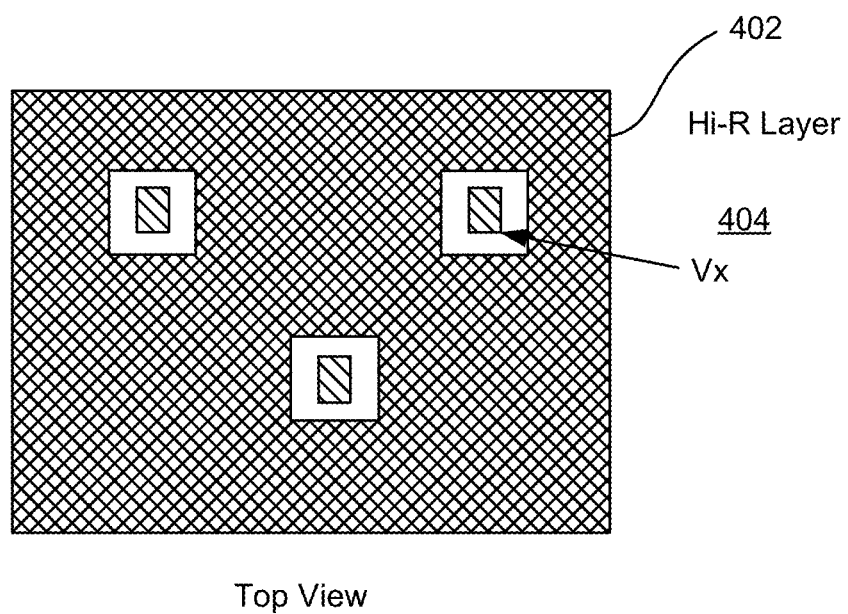
FIG. 4 illustrates an exemplary top view of a Hi-R conductor layer that may be used in a MOM capacitor in accordance with one or more aspects of the disclosure.

FIG. 4 illustrates an exemplary top view of a Hi-R conductor layer 402 that may be used in a MOM capacitor. The vias 404 (Vx) are representative vias that may be used to provide the interconnect mechanism for electrical coupling for use within a MOM capacitor and may also be used to provide for interconnections to other metal layers and components. In some aspects, the Hi-R conductor layer 402 may be disposed between metal layer Mx and metal layer Mx+1 and metal fingers can be patterned via connections between the Mx and Mx+1 fingers or for other portions of the Mx and Mx+1 metal layers. Additionally, the fingers may be patterned with holes or openings to allow the vias to pass through to other metal layers.

It will be appreciated that the various aspects disclosed are not limited to the illustrated examples. For example, the number and location of the vias are provided merely for illustration. The notation of "Vx" and "Mx" may indicate an associated with the vias and metal layers, in some aspects for convenience of explanation. However, the disclosure should not be limited to specific notation and the functional interconnection of the vias with the various metal layers are not limited by the nomenclature used. Additionally, other connector or connecting technologies and methods can be used instead of the vias to interconnect the various metal layers.

In accordance with the various aspects disclosed herein, at least one aspect includes an apparatus including a metal oxide metal (MOM) capacitor. The MOM capacitor includes a first metal layer (e.g., Mx, Mx+1) having a first plurality of metal fingers (218, 222, 312), each of the first plurality of fingers being configured to have alternating polarities. The MOM capacitor includes a high resistance (Hi-R) conductor layer (e.g., 219, 223, 311) disposed adjacent the first metal layer in a plane parallel to the first metal layer. As discussed above, among the various technical advantages the various aspects disclosed provide, in at least some aspects, the Hi-R conductor layer provides for increased capacitance when configured as an active layer of the MOM capacitor and improved metal layer utilization when configured as a shielding layer, as discussed above. In other aspects, when the Hi-R conductor layer is a shielding layer, it can be configured as a generally solid plate, which provides improved shielding in comparison to conventional metal lines used in a conventional shielding layer.

Other technical advantages will be recognized from various aspects disclosed herein and these technical advantages are merely provided as examples and should not be construed to limit any of the various aspects disclosed herein.

Figure 5A:
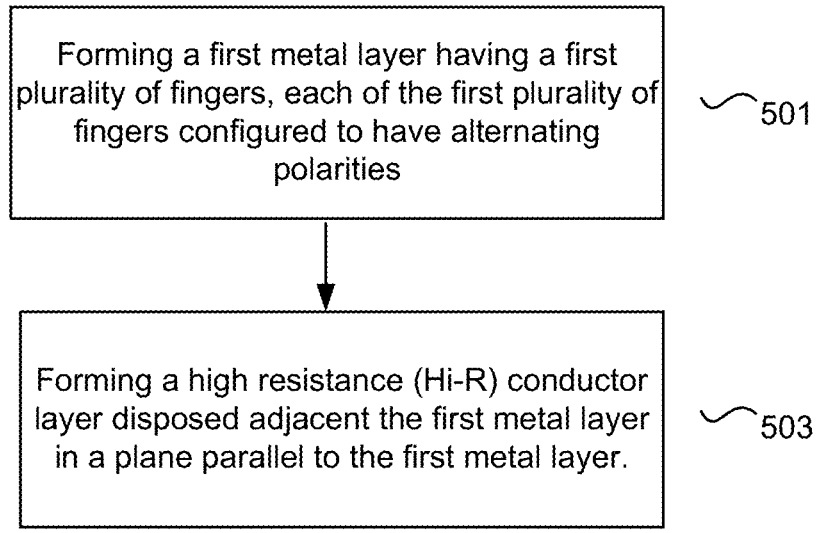
FIGS. 5A-B illustrates exemplary manufacturing process flows to fabricate an exemplary device in accordance with one or more aspects of the disclosure.

FIG. 5A illustrates a method of fabricating a metal oxide metal (MOM) capacitor. In block 501 the method may include forming a first metal layer having a first plurality of fingers, each of the first plurality of fingers being configured to have alternating polarities. In block 503 the method may include forming a high resistance Hi-R conductor layer disposed adjacent the first metal layer in a plane parallel to the first metal layer.

Figure 5B:
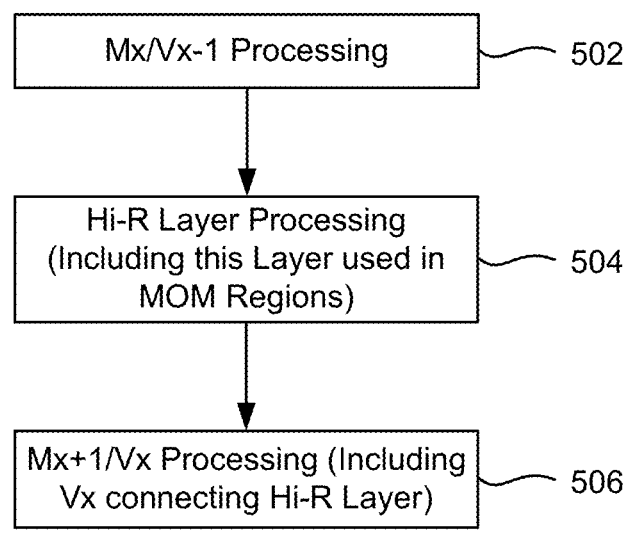

FIG. 5B illustrates another exemplary manufacturing process flow. In block 502, a metal layer Mx is processed (e.g., fingers, wiring, etc. are formed) along with a first set of vias (Vx-1) to provide connectivity via an electrical path between metal layers. In block 504, a Hi-R conductor layer is formed in the MOM capacitor regions 504. As discussed above, it will be appreciated that Hi-R conductor layer may be configured as an active portion of the MOM capacitor or may be configured as shielding layer for the MOM capacitor. In block 506, metal layer Mx+1 is processed (e.g., fingers, wiring, etc. are formed) and a set of vias Vx are also processed to provide interconnection between the metal layers. Additionally, the vias Vx can provide connections to the Hi-R conductor layer. It will be appreciated that many conventional manufacturing processes can used for fabricating the MOM capacitors, in accordance with the various aspects discloses. Accordingly, no additional masking or processing methods are needed to construct the MOM capacitors in accordance with the various aspects disclosed. The various aspects provide for improved performance and yield and reduced manufacturing complexity. As discussed in the foregoing, the various aspects include configurations of the Hi-R conductor layer as an active layer in a MOM capacitor or as a shielding layer for a MOM capacitor without incurring any additional manufacturing costs.

Figure 6:
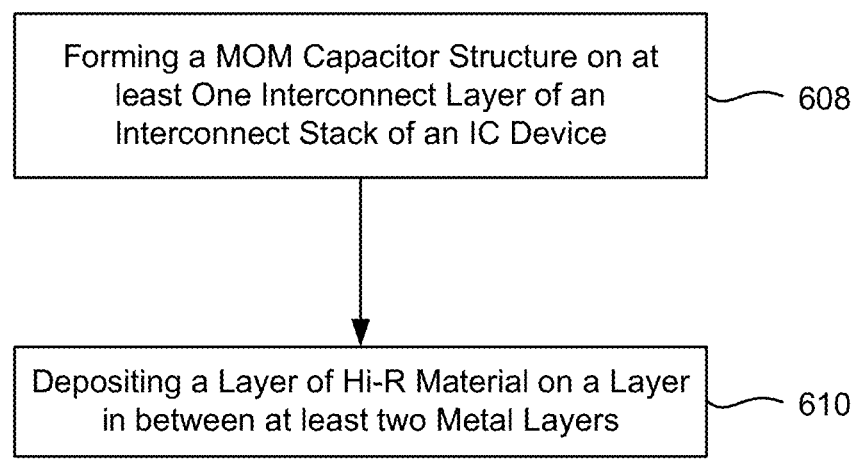
FIG. 6 illustrates another exemplary method for fabricating a device in accordance with one or more aspects aspect of the disclosure.

FIG. 6 illustrates another exemplary method for fabricating a device in accordance with at least one aspect of the present disclosure. In block 608, a MOM capacitor structure may be formed on at least one interconnect layer of an interconnect stack of an integrated circuit (IC) device. Those skilled in the art will appreciate that the sequence of the fabrication processes are not necessarily in any order and later processes may be discussed earlier to provide an example of the breadth of the various aspects disclosed.

In block 610, a layer of Hi-R material is deposited on a layer located in between at least two metal layers. As discussed previously, a first metal layer (e.g., Mx, Mx+1) may be formed having a first plurality of metal fingers (e.g., 218, 222, 312), each of the first plurality of fingers being configured to have alternating polarities. Again, the method may also include forming a high resistance (Hi-R) conductor layer (e.g., 311, 219, 223) disposed adjacent the first metal layer in a plane parallel to the first metal layer.

Accordingly, it will be appreciated from the foregoing disclosure that additional processes for fabricating the various aspects disclosed herein will be apparent to those skilled in the art and a literal rendition of the processes discussed above will not be provided or illustrated in the included drawings. For example, it will be appreciated that the Hi-R conductor layer may be deposited in any location, or combination of locations in the capacitor structure that is being formed. For example, the Hi-R conductor layer may be located on the lower regions, the middle regions or the upper regions, depending upon where the various design consideration for the structure.

The disclosed MOM capacitor may also be incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle. It should be also understood that the devices and methods shown and described herein may omit descriptions and/or illustrations of conventional package assembly components or activities in the interest of brevity without prejudice or disclaimer.

Figure 7:
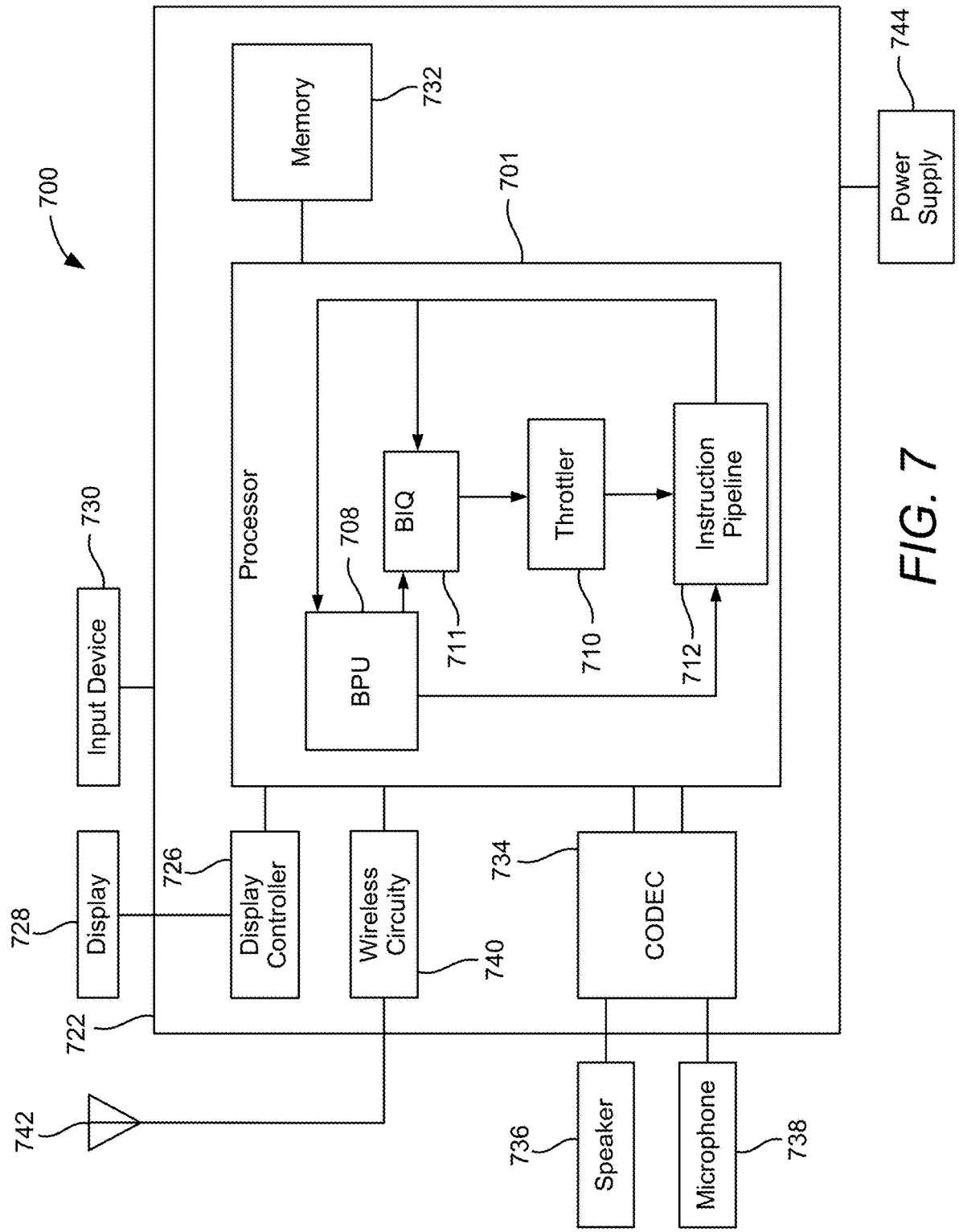
FIG. 7 illustrates an exemplary mobile device in accordance with one or more aspects of the disclosure.

FIG. 7 illustrates an exemplary mobile device in accordance with some examples of the disclosure. Referring now to FIG. 7, a block diagram of a mobile device that is configured according to exemplary aspects is depicted and generally designated 700. In some aspects, mobile device 700 may be configured as a wireless communication device. As shown, mobile device 700 includes processor 701, which may be configured to implement the methods described herein in some aspects. Processor 701 is shown to comprise instruction pipeline 712, buffer processing unit (BPU) 708, branch instruction queue (BIQ) 711, and throttler 710 as is well known in the art. Other well-known details (e.g., counters, entries, confidence fields, weighted sum, comparator, etc.) of these blocks have been omitted from this view of processor 701 for the sake of clarity.

Processor 701 may be communicatively coupled to memory 732 over a link, which may be a die-to-die or chip-to-chip link. Mobile device 700 also include display 728 and display controller 726, with display controller 726 coupled to processor 701 and to display 728.

In some aspects, FIG. 7 may include coder/decoder (CODEC) 734 (e.g., an audio and/or voice CODEC) coupled to processor 701; speaker 736 and microphone 738 coupled to CODEC 734; and wireless controller 740 (which may include a modem) coupled to wireless antenna 742 and to processor 701.

In one particular aspect, where one or more of the above-mentioned blocks are present, processor 701, display controller 726, memory 732, CODEC 734, and wireless controller 740 can be included in a system-in-package or system-on-chip device 722. Input device 730 (e.g., physical or virtual keyboard), power supply 744 (e.g., battery), display 728, input device 730, speaker 736, microphone 738, wireless antenna 742, and power supply 744 may be external to system-on-chip device 722 and may be coupled to a component of system-on-chip device 722, such as an interface or a controller.

It should be noted that although FIG. 7 depicts a mobile device, processor 701 and memory 732 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 8:
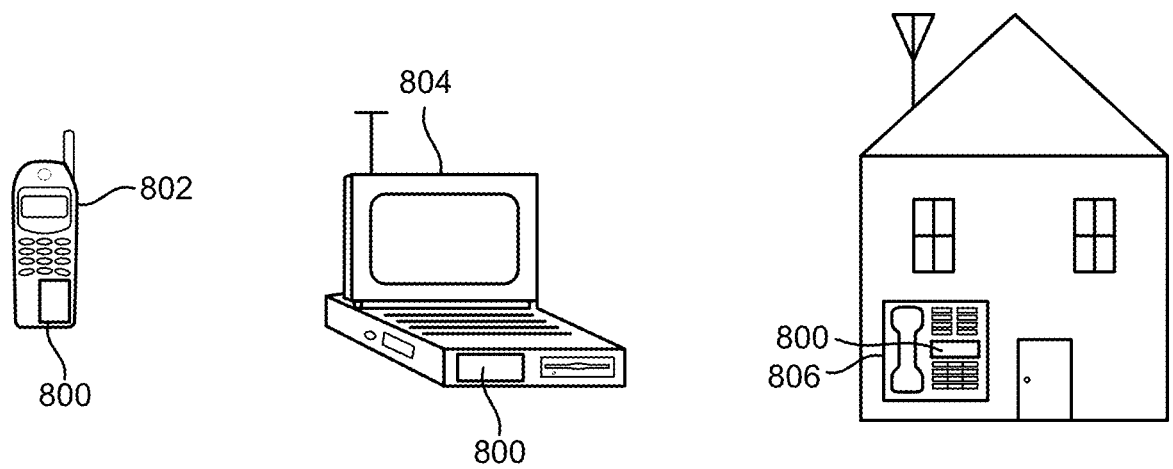
FIG. 8 illustrates various electronic devices that may be integrated with any of the aforementioned MOM capacitors in accordance with one or more aspects of the disclosure.

FIG. 8 illustrates various electronic devices that may be integrated with any of the aforementioned integrated device, semiconductor device, integrated circuit, die, interposer, package or package-on-package (PoP) in accordance with some examples of the disclosure. For example, a mobile phone device 802, a laptop computer device 804, and a fixed location terminal device 806 may include an integrated device 800 as described herein. The integrated device 800 may be, for example, any of the integrated circuits, dies, integrated devices, integrated device packages, integrated circuit devices, device packages, integrated circuit (IC) packages, package-on-package devices described herein. The devices 802, 804, 806 illustrated in FIG. 8 are merely exemplary. Other electronic devices may also feature the integrated device 800 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

It will be appreciated that various aspects disclosed herein can be described as functional equivalents to the structures, materials and/or devices described and/or recognized by those skilled in the art. It should furthermore be noted that methods, systems, and apparatus disclosed in the description or in the claims can be implemented by a device comprising means for performing the respective actions of this method. It will be appreciated that the aforementioned aspects are merely provided as examples and the various aspects claimed are not limited to the specific references and/or illustrations cited as examples.

One or more of the components, processes, features, and/or functions illustrated in Figures may be rearranged and/or combined into a single component, process, feature or function or incorporated in several components, processes, or functions. Additional elements, components, processes, and/or functions may also be added without departing from the disclosure. It should also be noted that the description in the present disclosure is not limited to dies and/or ICs. In some implementations, FIGS. 1-5 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer. An active side of a device, such as a die, is the part of the device that contains the active components of the device (e.g., transistors, resistors, capacitors, inductors etc.), which perform the operation or function of the device. The backside of a device is the side of the device opposite the active side. As used herein, a metallization structures may include metal layers, vias, pads, or traces with dielectric between, such as a redistribution layer or RDL).

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wire line connection, or other connection, regardless of whether satellite signal reception, assistance data reception, and/or position-related processing occurs at the device or at the other device. In addition, these terms are intended to include all devices, including wireless and wire line communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wire line phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5 (both expressly incorporated herein in their entirety).

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples and is not intended to be limiting of examples of the disclosure. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Nothing stated or illustrated depicted in this application is intended to dedicate any component, action, feature, benefit, advantage, or equivalent to the public, regardless of whether the component, action, feature, benefit, advantage, or the equivalent is recited in the claims.

The methods, sequences and/or algorithms described in connection with the examples disclosed herein may be incorporated directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art including non-transitory types of memory or storage mediums. An exemplary storage medium is coupled to the processor such that the processor can read information from, and write information to, the storage medium. In the alternative, the storage medium may be integral to the processor.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an insulator and a conductor). Furthermore, it is also intended that aspects of a clause can be included in any other independent clause, even if the clause is not directly dependent on the independent clause.

Clause 1. An apparatus comprising a metal oxide metal (MOM) capacitor, the MOM capacitor comprising: a first metal layer having a first plurality of fingers, each of the first plurality of fingers configured to have alternating polarities; and a high resistance (Hi-R) conductor layer disposed adjacent the first metal layer in a plane parallel to the first metal layer.

Clause 2. The apparatus of clause 1, further comprising: a second metal layer, wherein the Hi-R conductor layer is disposed between the first metal layer and the second metal layer.

Clause 3. The apparatus of clause 2, wherein the second metal layer has a second plurality of fingers, each of the second plurality of fingers configured to have alternating polarities and orientated in parallel with the first plurality of fingers.

Clause 4. The apparatus of clause 2, wherein the second metal layer has a second plurality of fingers, each of the second plurality of fingers configured to have alternating polarities and orientated perpendicular to the first plurality of fingers.

Clause 5. The apparatus of any of clauses 1 to 4, wherein the Hi-R conductor layer is configured as an additional active layer of the MOM capacitor.

Clause 6. The apparatus of any of clauses 1 to 4, wherein the Hi-R conductor layer is configured as a shielding layer of the MOM capacitor.

Clause 7. The apparatus of any of clauses 1 to 6, wherein geometric properties of the Hi-R conductor layer are used to control at least part of Hi-R properties.

Clause 8. The apparatus of any of clauses 1 to 7, wherein the Hi-R conductor layer is a continuous layer.

Clause 9. The apparatus of any of clauses 1 to 8, wherein the Hi-R conductor layer has a plurality of openings and at least some of the plurality of openings allow interconnections to the first metal layer.

Clause 10. The apparatus of any of clauses 1 to 9, further comprising: an integrated circuit (IC) having an interconnect stack, wherein the MOM capacitor is located in the interconnect stack.

Clause 11. The apparatus of clause 10, wherein the Hi-R conductor layer is located in at least one of a lower region of the interconnect stack, a middle region of the interconnect stack, or an upper region of the interconnect stack.

Clause 12. The apparatus of any of clauses 1 to 11, wherein the Hi-R conductor layer is disposed below the first metal layer.

Clause 13. The apparatus of any of clauses 1 to 11, wherein the Hi-R conductor layer is disposed above the first metal layer.

Clause 14. The apparatus of any of clauses 1 to 13, wherein the apparatus is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

Clause 15. A method of fabricating a metal oxide metal (MOM) capacitor comprising: forming a first metal layer having a first plurality of fingers, each of the first plurality of fingers configured to have alternating polarities; and forming a high resistance (Hi-R) conductor layer disposed adjacent the first metal layer in a plane parallel to the first metal layer.

Clause 16. The method of clause 15, further comprising: forming a second metal layer, wherein the Hi-R conductor layer is disposed between the first metal layer and the second metal layer.

Clause 17. The method of clause 16, wherein the second metal layer has a second plurality of fingers, each of the second plurality of fingers configured to have alternating polarities and orientated in parallel with the first plurality of fingers.

Clause 18. The method of clause 16, wherein the second metal layer has a second plurality of fingers, each of the second plurality of fingers configured to have alternating polarities and orientated perpendicular to the first plurality of fingers.

Clause 19. The method of any of clauses 15 to 18, wherein the Hi-R conductor layer is configured as an additional active layer of the MOM capacitor.

Clause 20. The method of any of clauses 15 to 18, wherein the Hi-R conductor layer is configured as a shielding layer of the MOM capacitor.

Clause 21. The method of any of clauses 15 to 20, wherein geometric properties of the Hi-R conductor layer are used to control at least part of Hi-R properties.

Clause 22. The method of any of clauses 15 to 21, wherein the Hi-R conductor layer is a continuous layer.

Clause 23. The method of any of clauses 15 to 22, wherein the Hi-R conductor layer has a plurality of openings and at least some of the plurality of openings allow interconnections to the first metal layer.

Clause 24. The method of any of clauses 15 to 23, further comprising: forming an integrated circuit (IC) having an interconnect stack, wherein the MOM capacitor is located in the interconnect stack.

Clause 25. The method of clause 24, wherein the Hi-R conductor layer is located in at least one of a lower region of the interconnect stack, a middle region of the interconnect stack, or an upper region of the interconnect stack.

Clause 26. The method of any of clauses 15 to 25, wherein the Hi-R conductor layer is disposed below the first metal layer.

Clause 27. The method of any of clauses 15 to 25, wherein the Hi-R conductor layer is disposed above the first metal layer.

Clause 28. The method of any of clauses 15 to 27, wherein the MOM capacitor is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

What is claimed is:

1. An apparatus comprising a metal oxide metal (MOM) capacitor, the apparatus comprising:

a first metal layer having a first plurality of fingers configured to have alternating polarities of the MOM capacitor;

first one or more dielectric layers;

a high resistance (Hi-R) conductor layer over the first one or more dielectric layers and the first metal layer, the first one or more dielectric layers being between and in contact with the first metal layer and the Hi-R conductor layer;

second one or more dielectric layers; and a second metal layer over the Hi-R conductor layer, the second one or more dielectric layers being between and in contact with the second metal layer and the Hi-R conductor layer, wherein:

the Hi-R conductor layer is disposed in a plane parallel to the first metal layer and parallel to the second metal layer.

2. The apparatus of claim 1, wherein the second metal layer has a second plurality of fingers configured to have alternating polarities of the MOM capacitor and orientated in parallel with the first plurality of fingers.

3. The apparatus of claim 1, wherein the second metal layer has a second plurality of fingers configured to have alternating polarities of the MOM capacitor and orientated perpendicular to the first plurality of fingers.

4. The apparatus of claim 1, wherein the Hi-R conductor layer is configured as an additional active layer of the MOM capacitor.

5. The apparatus of claim 1, wherein the Hi-R conductor layer is configured as a shielding layer of the MOM capacitor.

6. The apparatus of claim 1, wherein a resistivity of the Hi-R conductor layer is based on one or more geometric properties of the Hi-R conductor layer and is used to control at least part of Hi-R properties.

7. The apparatus of claim 1, wherein the Hi-R conductor layer is a continuous layer.

8. The apparatus of claim 1, wherein the Hi-R conductor layer has a plurality of openings and at least some of the plurality of openings allow interconnections to the first metal layer.

9. The apparatus of claim 1, further comprising:

an integrated circuit (IC) having an interconnect stack, wherein the MOM capacitor is located in the interconnect stack.

10. The apparatus of claim 9, wherein the Hi-R conductor layer is located in at least one of a lower region of the interconnect stack, a middle region of the interconnect stack, or an upper region of the interconnect stack.

11. The apparatus of claim 1, wherein the apparatus is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

12. A method of fabricating an apparatus that includes a metal oxide metal (MOM) capacitor, the method comprising:

forming a first metal layer having a first plurality of fingers configured to have alternating polarities of the MOM capacitor;

forming first one or more dielectric layers;

forming a high resistance (Hi-R) conductor layer over the first one or more dielectric layers and the first metal layer, the first one or more dielectric layers being between and in contact with the first metal layer and the Hi-R conductor layer;

forming second one or more dielectric layers; and forming a second metal layer over the Hi-R conductor layer, the second one or more dielectric layers being between and in contact with the second metal layer and the Hi-R conductor layer, wherein:

the Hi-R conductor layer is disposed in a plane parallel to the first metal layer and parallel to the second metal layer.

13. The method of claim 12, wherein the second metal layer has a second plurality of fingers configured to have alternating polarities of the MOM capacitor and orientated in parallel with the first plurality of fingers.

14. The method of claim 12, wherein the second metal layer has a second plurality of fingers configured to have alternating polarities of the MOM capacitor and orientated perpendicular to the first plurality of fingers.

15. The method of claim 12, wherein the Hi-R conductor layer is configured as an additional active layer of the MOM capacitor.

16. The method of claim 12, wherein the Hi-R conductor layer is configured as a shielding layer of the MOM capacitor.

17. The method of claim 12, wherein a resistivity of the Hi-R conductor layer is based on one or more geometric properties of the Hi-R conductor layer and is used to control at least part of Hi-R properties.

18. The method of claim 12, wherein the Hi-R conductor layer is a continuous layer.

19. The method of claim 12, wherein the Hi-R conductor layer has a plurality of openings and at least some of the plurality of openings allow interconnections to the first metal layer.

20. The method of claim 12, further comprising:

forming an integrated circuit (IC) having an interconnect stack, wherein the MOM capacitor is located in the interconnect stack.

21. The method of claim 20, wherein the Hi-R conductor layer is located in at least one of a lower region of the interconnect stack, a middle region of the interconnect stack, or an upper region of the interconnect stack.

22. The method of claim 12, wherein the MOM capacitor is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

23. The apparatus of claim 1, wherein the Hi-R conductor layer has a sheet resistance of 300-600 ohm/square area.

24. The method of claim 12, wherein the Hi-R conductor layer has a sheet resistance of 300-600 ohm/square area.

25. The apparatus of claim 1, wherein:

the second metal layer has a second plurality of fingers, a projection of the first plurality of fingers on the plane overlaps the Hi-R conductor layer, and a projection of the second plurality of fingers on the plane overlaps the Hi-R conductor layer.

26. The method of claim 12, wherein:

the second metal layer has a second plurality of fingers, a projection of the first plurality of fingers on the plane overlaps the Hi-R conductor layer, and a projection of the second plurality of fingers on the plane overlaps the Hi-R conductor layer.

* * * * *